United States Patent [19]

Hawes et al.

[11] Patent Number: 5,359,284

[45] Date of Patent: Oct. 25, 1994

[54] AIR CORE GAUGE MAGNETIC HYSTERESIS COMPENSATION

[75] Inventors: Kevin J. Hawes, Greentown; Reynolds P. Weber, Lafayette, both of Ind.

[73] Assignee: Delco Electronics Corp., Kokomo, Ind.

[21] Appl. No.: 944,378

[22] Filed: Sep. 14, 1992

[51] Int. Cl.$^5$ .................. G01R 5/16; G01P 3/42
[52] U.S. Cl. ........................ 324/146; 324/144; 324/160; 364/565; 364/571.01
[58] Field of Search ............... 324/160, 163, 166, 167, 324/132, 143, 144, 146, 154 R, 225; 364/565, 571.01, 571.07

[56] References Cited

U.S. PATENT DOCUMENTS

| | | | |
|---|---|---|---|
| 3,796,951 | 3/1974 | Joseph | 324/122 |
| 4,577,143 | 3/1986 | Eschrich et al. | 318/701 |
| 4,827,209 | 5/1989 | Tanaka et al. | 324/167 X |
| 4,928,060 | 5/1990 | Ito | 324/146 X |
| 5,017,861 | 5/1991 | Hukuda | 324/143 |
| 5,051,688 | 9/1991 | Murase et al. | 324/143 |

FOREIGN PATENT DOCUMENTS

| | | | |
|---|---|---|---|
| 0002672 | 1/1991 | Japan | 324/146 |
| 291163 | 10/1992 | Japan | 324/146 |

OTHER PUBLICATIONS

Nagami et al, SAE Technical Paper Series No. 920599, Development of an Analog Speedometer Mutually Compatible With A Digital Head Up Display, Feb. 24-28, 1992.

*Primary Examiner*—Gerard R. Strecker
*Attorney, Agent, or Firm*—Anthony Luke Simon; Jimmy L. Funke

[57] ABSTRACT

An air core gauge apparatus includes a sensor for determining a measure of a parameter, a microprocessor controller receiving the measure of parameter from the sensor and operative to (a) determine an ideal gauge position responsive to the parameter measurement, (b) determine a center position representing assumed magnetic hysteresis center, (c) compare the ideal position to the center position to determine an offset value, (d) determine a command signal responsive to the ideal signal and the difference signal, and (e) output the command signal, an air core gauge display including an air core gauge, a pointer, and graphics, the pointer being pivotally mounted and rotatable in response to commands given to the air core gauge to indicate information in the display, and an air core gauge driver for driving the gauge responsive to the command signal to rotate the gauge to an angular position representative of the parameter measurement, compensating for effects of magnetic hysteresis in the air core gauge.

10 Claims, 5 Drawing Sheets

AIR CORE GAUGE MAGNETIC HYSTERESIS COMPENSATION

This invention relates to vehicle instrumentation and more particularly to a method and apparatus for use in vehicle instrumentation air core gauge displays.

BACKGROUND OF THE INVENTION

A typical air core gauge comprises a magnetic rotor, two or more coils wound around the magnetic rotor, a spindle attached to the shaft of the magnetic rotor and a pointer tip on the end of the spindle. The magnetic rotor is pivotally mounted within the coils, to which an electric current is applied. When the electric current is applied to the coils, the coils generate a magnetic flux that acts upon the magnetic rotor causing rotation of the rotor until the rotor is aligned with the composite magnetic vector generated by the coils. The magnetic rotor causes the spindle to rotate, in turn rotating the pointer, which is used as a gauge to display information.

Typically, a metal shield surrounds the coil and magnet assembly to prevent external fields from disrupting the magnetic vector created by the coils. This metal shield may be referred to as the "can". In operation of the gauge, the can exhibits a slight residual magnetic field that affects the pointer deflection angle causing a magnetic hysteresis. Air core gauges also have a mechanical hysteresis that affects the gauge operation, but which is reduced by normal driving vibrations in the vehicle. The magnetic hysteresis in the can resists changes to the magnetic field created by the coils, thus affecting the resultant magnetic vector to which the rotor aligns itself and thus causing positional error in the pointer of the gauge.

SUMMARY OF THE PRESENT INVENTION

This invention provides an apparatus and method that advantageously reduces the adverse effects of the above described mechanical limitations of air core gauge mechanisms. Advantageously, the apparatus and method of this invention provide compensation to offset magnetic hysteresis within an air core gauge mechanism. Advantageously, the apparatus and method of this invention provide increased accuracy in vehicle information systems employing air core gauges.

Advantageously, the apparatus of this invention provides a vehicle speedometer with increased accuracy. Advantageously, the apparatus of this invention also provides a vehicle tachometer with increased accuracy.

Advantageously, this invention provides a method for driving a vehicle speedometer/tachometer or other air core gauge system in a manner providing increased accuracy of the information displayed.

The method of this invention accomplishes advantages recited herein according to the steps of: (a) determining an ideal gauge position, (b) determining a center angle representative of an assumed center position of a magnetic hysteresis, (c) comparing the ideal gauge position to the center angle, (d) developing a gauge position command responsive to 1) the ideal gauge position and 2) the comparison between the ideal gauge position and the center angle and (e) driving the air core gauge according to the determined command.

The apparatus of this invention achieves the advantages recited herein with a structure comprising an air core gauge, means for measuring a vehicle parameter, means for determining an ideal gauge position responsive to the parameter measurement, means for determining a center position representative of an assumed center of magnetic hysteresis, means for comparing the center position with the ideal gauge position, means for determining a gauge command responsive to the ideal gauge position and the comparison, means for outputting the gauge command to the air core gauge and means for driving the air core gauge responsive to the output gauge command.

A more detailed description of the invention, along with various embodiments thereof are set forth below.

DETAILED DESCRIPTION OF THE INVENTION

Figure 1:
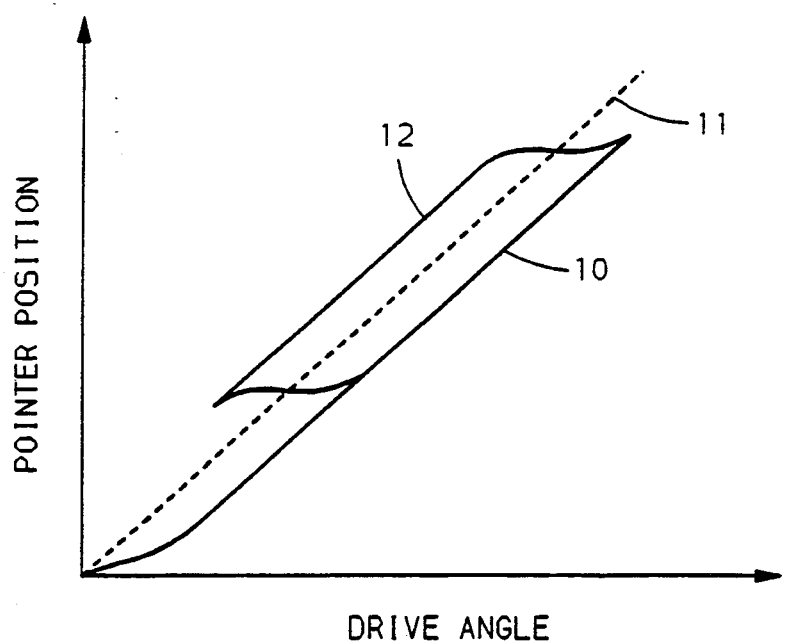
FIG. 1 illustrates a magnetic hysteresis curve of an air core gauge.

Referring to FIG. 1, the hysteresis graph shown illustrates the problem addressed by this invention and the errors that this invention corrects. Line 11 represents an ideal pointer position vs. drive angle for an air core gauge. If an angular position command is applied to the gauge, the actual angular position of the gauge follows the hysteresis curves represented by traces 10 and 12. If the angular position of the gauge is increasing, the actual position of the gauge lags the ideal position, being slightly less than the ideal position as shown by trace 10. Similarly, if the angular position of the gauge is decreasing, the actual position of the gauge is slightly higher than the ideal position, as indicated by trace 12 on the graph.

Figure 2:
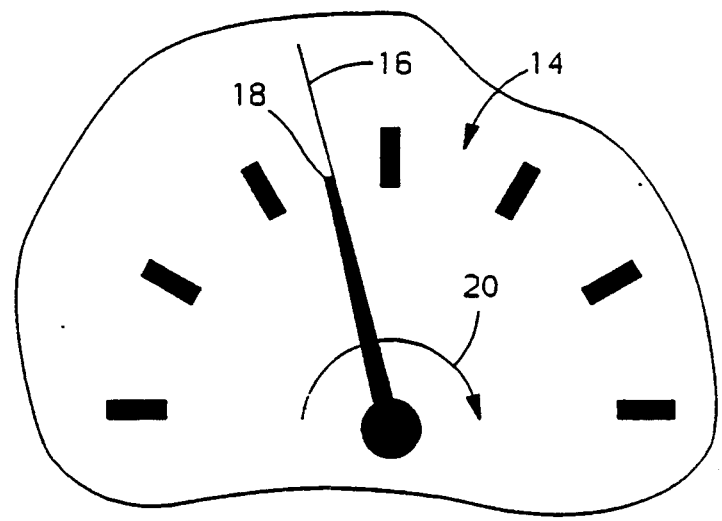
FIGS. 2 and 3 illustrate pointer error caused by magnetic hysteresis in an air core gauge.
Figure 3:
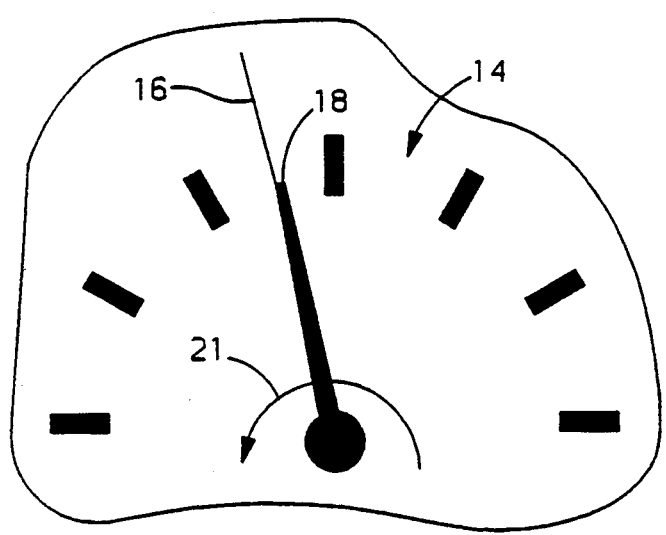

FIGS. 2 and 3 graphically depict the effect of hysteresis in relation to an air core gauge apparatus and this invention. For the gauge display 14 shown in FIG. 2, if the angular position of the gauge is increasing, as represented by arrow 20, the actual position of pointer 18 is slightly less than the drive angle represented by line 16. Similarly, in FIG. 3, when the angular position of pointer 18 is decreasing, as represented by arrow 21, the actual angular position of pointer 18 is slightly greater than the drive angle 16. These variances of pointer position in relation to the drive angle applied to the air core gauge are due, in large part, to magnetic hysteresis in the air core gauge mechanism.

Figure 4:
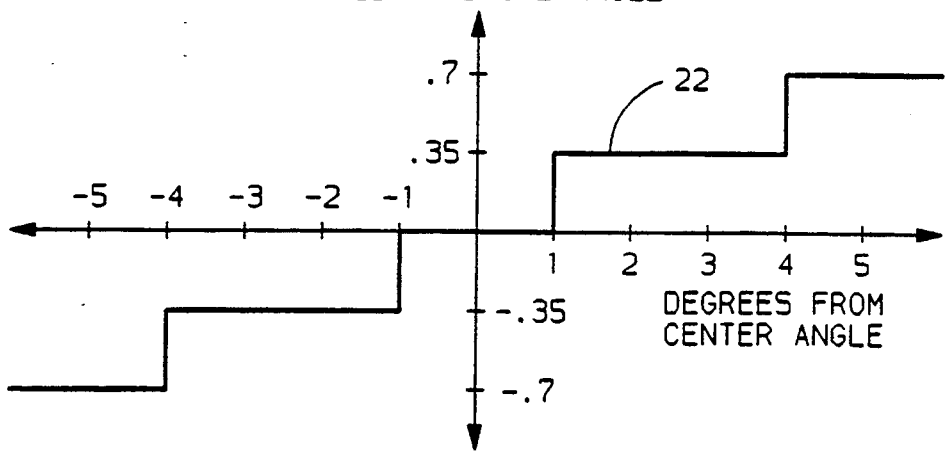
FIG. 4 is a graph illustrating the control structure of this invention.

Referring to FIG. 4, trace 22 in the graph shown illustrates the control structure of this invention to compensate for magnetic hysteresis in the air core gauge. The horizontal axis represents the difference between the desired pointer position and a center angle representing a position of assumed zero magnetic hysteresis. In general, the center angle is determined through the assumption that the angular position of the rotor (and pointer) at which there is zero magnetic hysteresis lags the commanded pointer position by 5°.

For example, at start-up both the initial pointer position and center angle are assumed to be zero. If the pointer is then commanded to move to the 15° position, the center angle is assumed to lie at the 10° angular position. In a similar manner, if the pointer is again returned to the 0° position, the center angle is assumed to move to the 5° angular position.

The command structure shown on FIG. 4 illustrates the offset provided to the air core gauge to compensate for magnetic hysteresis. If the ideal gauge position is within 1° of the center position, as determined in the manner described above, no offset is provided and the air core gauge is driven with a command representing the ideal gauge position. If the ideal gauge position is between 1°-4° away from the center angle, the gauge command is offset by a first amount, preferably 0.35° from the ideal command, in the direction away from the center angle. For example, if the ideal position is between 1°-4° greater than the center angle, the air core gauge is driven with a command representing the ideal gauge position with a 0.35° offset added. Similarly, if the ideal gauge position is between 1°-4° less than the center angle, the air core gauge is driven with a command representing the ideal gauge position with a 0.35° offset subtracted from the ideal position. If the ideal gauge position is further than 4° away from the center angle, then a second, greater, offset is added to the ideal position in the direction away from the center angle to determine the actual command applied to the gauge. A suitable number for the second offset is 0.7°.

Figure 5:
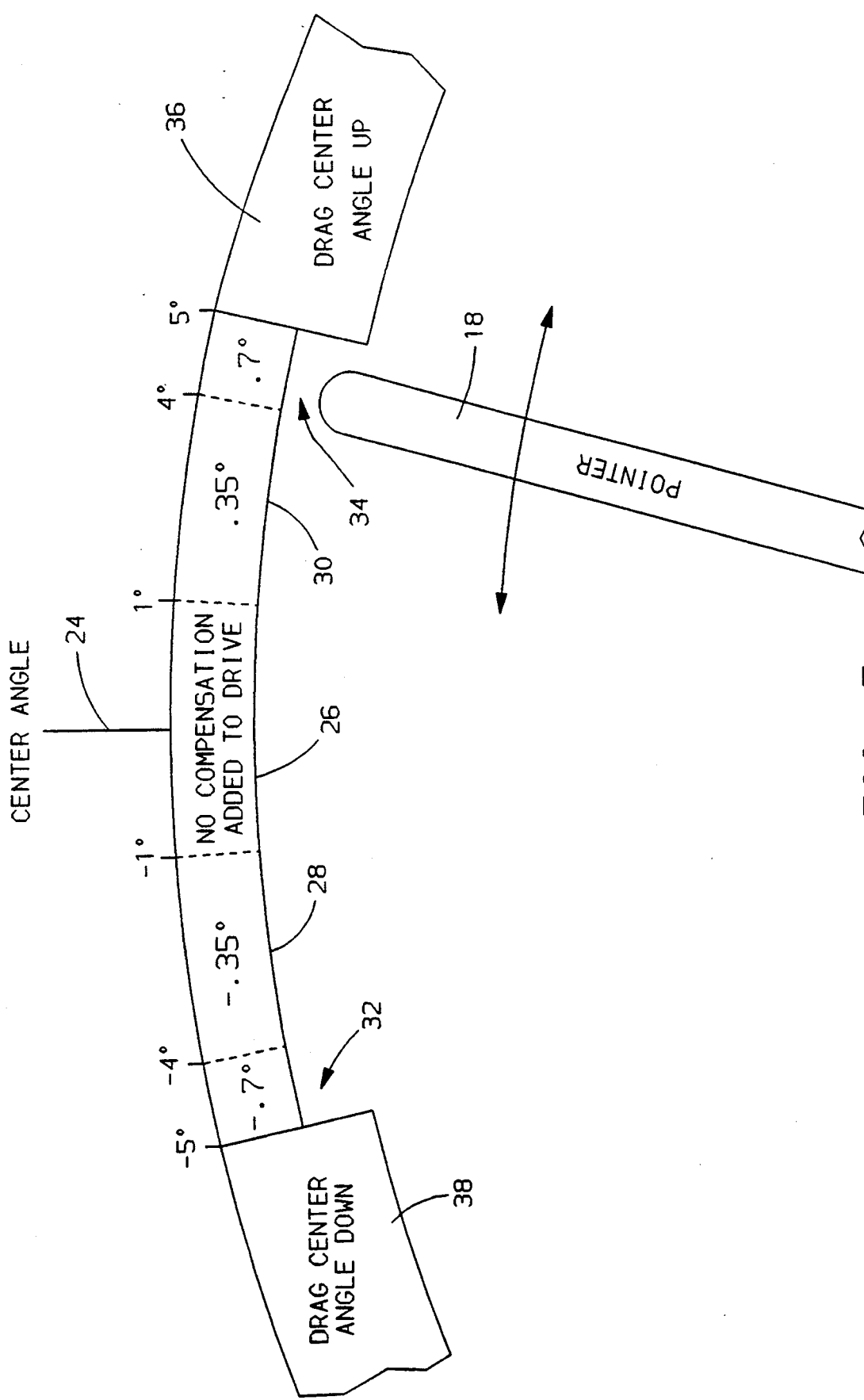
FIG. 5 illustrates graphically the control structure of this invention.

FIG. 5 illustrates the operation of this invention with relation to pointer 18 and angular positions on the gauge display. Assuming position 24 represents the determined center angle, if the ideal pointer position is within the region 26, which falls +/−1° of center angle 24, no compensation is made and the gauge command is set equal to the ideal pointer position. If the ideal pointer position falls in the region 30, between 1° and 4° greater than center angle 24, the first offset is added to the ideal pointer position to determine the gauge command. If the ideal pointer position falls within the region 34, which represents any position greater than the region 30, the second offset is added to the ideal pointer position to determine the gauge command. Similarly, if the ideal pointer position falls within the region 28, between 1° and 4° less than center angle 24, the first offset is subtracted from ideal gauge position to determine the gauge command and if the ideal pointer position falls within the region 32, which represents any position less than region 28, the second offset is subtracted from the ideal gauge command to determine the applied gauge command.

Regions 36 and 38 are regions in which the ideal angular positions are greater than or less than the center angle by at least 5°. If the ideal pointer position falls within region 36, the center angle is adjusted to a new center angle that is 5° less than the commanded gauge position. Similarly, if the ideal gauge position falls within region 38, after the gauge command is determined, the center angle is adjusted to be 5° greater than the commanded gauge angle.

Figure 6:
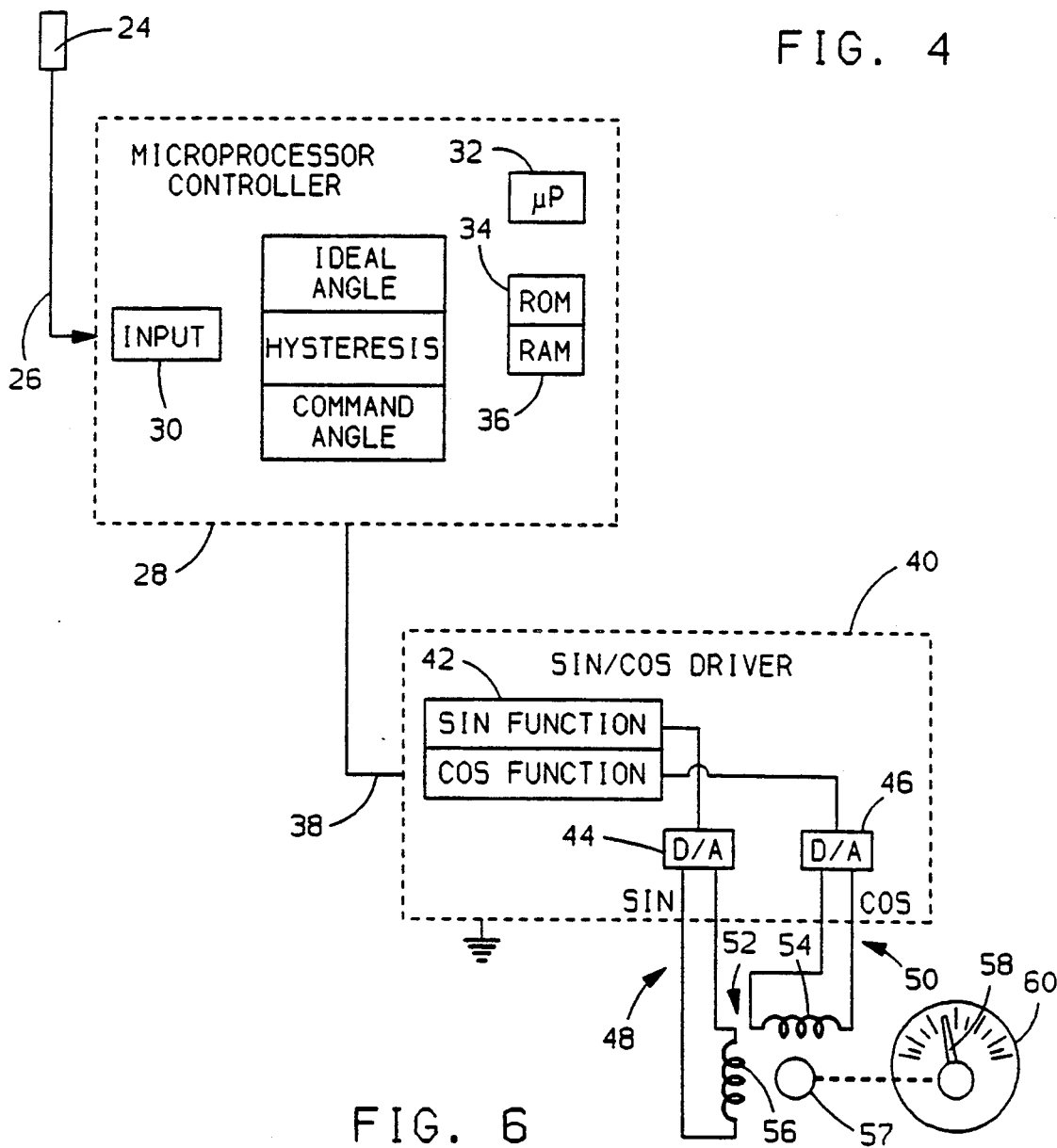
FIG. 6 illustrates the apparatus of this invention.

FIG. 6 illustrates the apparatus of this invention suitable for use in a vehicle speedometer (or tachometer) system. The apparatus shown includes sensor 24, microprocessor controller 28 including microprocessor 32, ROM and RAM memories 34 and 36, and input unit 30. Serial data link 38 connects microprocessor controller 28 to a sin/cosine gauge driver circuit 40, including sin and cosine function generator 42, and D/A converters 44 and 46. Gauge driver circuit 40 is connected to and drives gauge 52.

In operation, sensor 24 picks up a rotational speed signal from the vehicle transmission to sense vehicle speed in a manner well known to those skilled in the art. The signal is provided on line 26 to microprocessor controller 28. The microprocessor controller 28 converts the signals on line 26 to a numerical signal representing vehicle speed. The vehicle speed signal is then converted to an angular position signal representing the ideal angular position of pointer 58 in relation to graphics 60 in gauge 52.

Developing the ideal angular position signal may be accomplished in a manner such as looking up, in a look-up table, an angular position signal in response to the developed speed signal. Other processing may be involved such as adding a term that compensates for the pointer tip weight. This may also be done with a look-up table, i.e., the compensation term is looked up in response to the angular position signal and comprises a reference angle that is then added to the angular position signal to get the ideal angular position signal. Hysteresis compensation according to this invention is then applied to the ideal angular position signal to determine the gauge command in the manner described above and as set forth in more detail below with respect to FIG. 7.

The gauge command is output on serial data link 38, which transfers the 10-bit gauge command to sin/cosine driver 40. Sin/cosine drivers, such as sin/cosine driver 40, are well known to those skilled in the art and come in a variety of forms responsive to digital and/or analog signals. In the digital implementation shown, sin/cosine driver 40 receives the 10-bit word in an input latch (not shown), which latches in the 10-bit word and provides the 10-bit word to function generator 42. Function generator 42 generates the sin and cosine components of the gauge command represented by the 10-bit word received through line 38. The sin and cosine components of the command are converted to analog signals through D/A converters 44 and 46 and output to gauge 52 through lines 48 and 50. Lines 48 provides the sin component of the command to coil 56 and lines 50 provides the cosine component of the gauge command to coil 54, which is mounted perpendicular to coil 56. Coils 56 and 54 generate magnetic vectors comprising the sin and cosine components of the desired magnetic vector respectively. The magnetic vectors generated by the two coils together form a composite magnetic vector operating on magnetic rotor 57, which rotates to align itself with the composite magnetic vector at the commanded angle (+/− hysteresis affect), in turn, causing rotation of pointer 58 in relation to graphics 60 to provide speed information to the vehicle driver.

Figure 7:
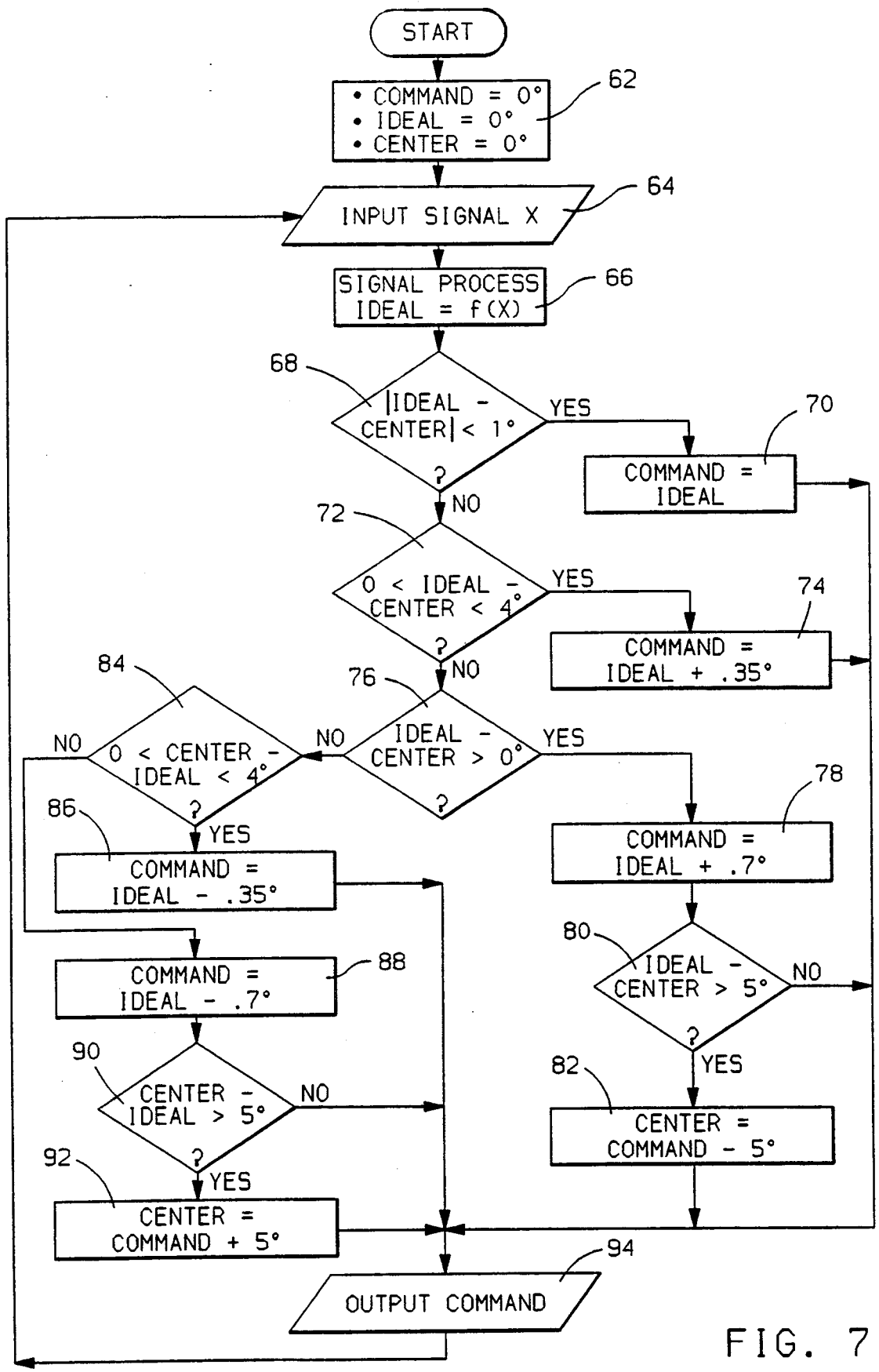
FIG. 7 illustrates a flow routine for a computer implementation of this invention.

Referring to FIG. 7, a microprocessor flow routine for implementation of this invention into microprocessor controller 28 is set forth. At start-up, block 62 sets the variables COMMAND, IDEAL and CENTER to zero. At block 64 an input signal is received representing vehicle speed. The input signal can be in a variety of forms such as a frequency signal, a pulse count or any other known method of representing vehicle speed. The apparatus in FIG. 6 shows the input signal coming from speed sensor 24. However, this is an example implementation and the signal may come from other sources such as the vehicle microprocessor control unit, which itself receives a speed signal from a speed sensor, such as sensor 24.

Block 66 represents general signal processes well known to those skilled in the art, where the input signal is converted to an engineering unit such as miles-per-hour or kilometers-per-hour, or in the case of tachometers, rotations-per-minute. Once this signal representing the engineering unit is developed, a reference angle may be determined from a look-up table. The reference angle represents the desired angular position for the pointer on the gauge corresponding to the determined engineering unit.

Other processing at block 66 may also be implemented. For example, if the pointer is tip-heavy, a compensation term may be looked-up from a look-up table in computer memory in response to the reference angle. The signal IDEAL, representing the ideal drive angle for the gauge, is then developed equal to the reference angle plus the pointer tip compensation term. This is one example implementation of the functions that may be performed at block 66 and any functions that develop a signal IDEAL, representing the ideal drive angle for the air core gauge, may be alternatively substituted.

After block 66, the routine moves to block 68 where the variable IDEAL is compared to the variable CENTER, representing the assumed center position of magnetic hysteresis where there is zero hysteresis effect. If the difference between IDEAL and CENTER is less than 1°, the variable COMMAND, representing the output command used to drive the air core gauge, is set equal to IDEAL at block 70 and output at block 94.

If the difference between the variable IDEAL and the variable CENTER is not less than 1°, the routine moves to block 72 where it is determined if the difference, IDEAL−CENTER, is between 0 and 4 degrees. If the difference IDEAL−CENTER falls within the range of 0 to 4 degrees, the routine moves to block 74 where the variable COMMAND is set equal to the variable IDEAL +0.35° offset. The routine then moves to block 94 to output COMMAND. If the difference, IDEAL−CENTER, was not between zero and 4 at block 72, the routine moves to block 76 where the difference, IDEAL−CENTER is compared to zero. If IDEAL−CENTER is greater than zero, then it is known at this point that IDEAL−CENTER is at least 4° and at block 78 the variable COMMAND is set to IDEAL +0.7°, the maximum offset.

The routine then moves to block 80 where the difference, IDEAL−CENTER is compared to 5°. If IDEAL−CENTER is greater than 5°, then a new center angle is determined at block 82 as CENTER=COMMAND−5°. The routine then moves to block 94 to output the variable COMMAND to drive the air core gauge. If at block 76 the difference, IDEAL−CENTER, is not greater than zero, then it is known that the angular position desired is less than the center position. The routine then moves to block 84 where the difference, CENTER−IDEAL, is determined. If CENTER−IDEAL is within the range of 0 to 4, the routine moves to block 86 where COMMAND is set equal to IDEAL−0.35°. The routine then moves to block 94 where the variable COMMAND is output to drive the gauge.

If at block 84 the difference, CENTER−IDEAL, was not between 0 and 4, the routine moves to block 88 where it is known that the difference, CENTER−IDEAL, is at least 4° so the variable COMMAND is set equal to the variable IDEAL −0.7°, the maximum offset.

The routine then moves to block 90 where the difference, CENTER−IDEAL is compared to 5°. If the difference, CENTER−IDEAL, is greater than 5°, the routine moves to block 92 where a new center position is determined according to CENTER=COMMAND+5°. If the difference, CENTER−IDEAL, was not greater than 5° at block 90, the routine moves to block 94. At block 94 the variable COMMAND is output to the sin/cosine drive unit 40 and the routine moves to block 64 to await the next input signal.

Figure 8:
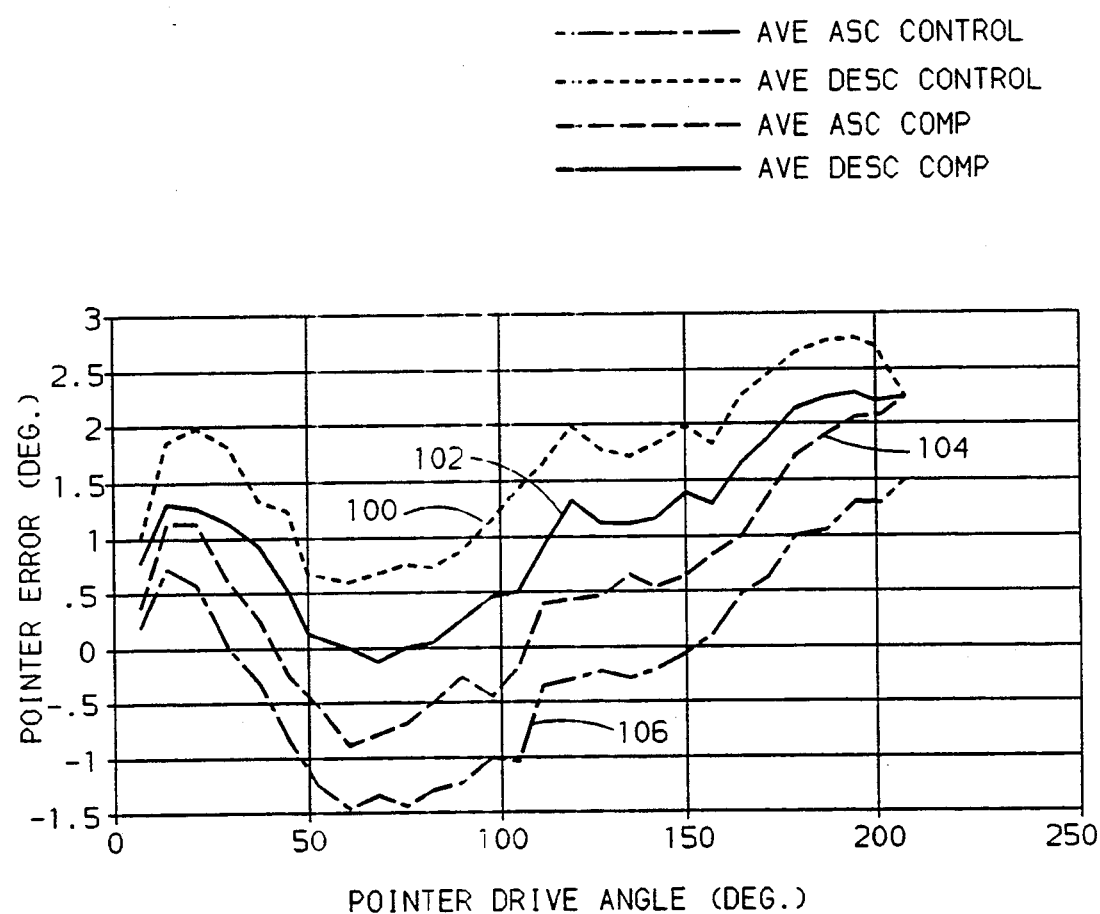
FIG. 8 illustrates a graph of experimental results showing improved accuracy in the speedometer system implementing the apparatus and method of this invention.

Implementation of the flow routine shown in FIG. 7 and the computer controller 28 shown in FIG. 6 provides operation of the gauge apparatus according to the control structure of this invention as shown in FIGS. 4 and 5 and as described above. Implementation of this invention into an air core gauge system, such as in a vehicle speedometer, results in improved accuracy of the indicated display. FIG. 8 shows the improved accuracy achieved by an implementation of this invention.

The horizontal axis indicates the gauge drive angle, which ranges from zero to 210° and the vertical axis indicates the pointer error with a zero line corresponding to zero pointer error. Trace 106 represents the pointer position during ascent up the pointer scale and trace 100 represents pointer position during descent of the angular position down the pointer scale. The relatively large error differences between ascent and descent of the pointer due to magnetic hysteresis are exemplified by the large distance between traces 100 and 106. Traces 104 and 102 represent positional error during angular ascent and descent when the method and apparatus of this invention as described above are implemented. As can be seen, lines 102 and 104 are much closer together than lines 100 and 106, illustrating the reduction in the error due to magnetic hysteresis when this invention is implemented.

The improved results achieved by this invention illustrated in FIG. 8 represents an increase in accuracy of 1.4° or almost 1 mile per hour in the experimental speedometer in which 1.5° angular movement correspondent to 1 mile-per-hour on the speedometer graphics.

In the implementation set forth above with reference to FIG. 7, the center angle CENTER is computed as lagging the variable COMMAND by 5°. Alternatively, CENTER may be determined as lagging the variable IDEAL by 5°. This alternative can easily be implemented by those skilled in the art by substituting the variable IDEAL for the variable COMMAND when determining the variable CENTER.

Although the implementation of this invention set forth above describes a speedometer system, this invention can easily be installed in a vehicle tachometer system by those skilled in the art using the information set forth above. To implement this invention into a tachometer system, an engine speed signal is measured (instead of vehicle speed) and indicated by gauge 52. Likewise, any other air core gauge implementation in which magnetic hysteresis plays an effect may be used with this invention where the parameter determined by sensor 24 is the desired parameter being measured and where the gauge 52 indicates the desired measurement.

Moreover, various improvements and modifications to this invention may occur to those skilled in the art, which improvements and modifications will fall within the scope of this invention as set forth below.

The embodiments of the invention in which an exclusive property or privilege is claimed are defined as follows:

1. An apparatus comprising:
   a sensor for determining a measure of a parameter;
   an air core gauge display including an air core gauge, a pointer, and graphics, the pointer being pivotally mounted and magnetically rotatable in response to a drive signal;
   a microprocessor controller receiving the measure of the parameter from the sensor and operative to (a) determine an ideal gauge position responsive to the parameter measurement, (b) determine a center position representing an assumed position of the pointer of the air core gauge at which there is zero magnetic hysteresis, (c) compare the ideal position to the center position to determine an offset value, (d) determine a command signal responsive to the ideal gauge position and the offset value, and (e) output the command signal; and
   means for driving the gauge, and providing the drive signal responsive to the command signal to rotate the pointer to an angular position representative of the parameter measurement.

2. A method of driving an air core gauge having a pointer magnetically rotatable in response to a driving signal comprising the steps of:
   determining a parameter measurement;
   determining an ideal gauge position signal responsive to the parameter measurement;
   determining a center signal representative of an assumed position of the pointer of the air core gauge at which there is zero magnetic hysteresis;
   comparing the center signal to the ideal signal to determine a difference signal;
   determining a command signal responsive to the ideal signal and the difference signal;
   outputting the command signal; and
   driving the pointer of the air core gauge in accordance with the command signal operationally compensating for the magnetic hysteresis in the air core gauge and providing an accurate indication of the measurement of the parameter.

3. The method of claim 2, wherein the step of determining the command signal comprises the sub-steps of:
   determining if the difference signal is within a first, a second or a third range of values;
   if the difference signal is within the first range of values, setting the command signal equal to the ideal signal;
   if the difference signal is within the second range of values, setting the command signal equal to the ideal signal summed with a first offset; and
   if the difference signal is within the third range of values, setting the command signal equal to the ideal signal summed with a second offset.

4. The method of claim 2, wherein the step of determining the center signal comprises the sub-steps of:
   comparing the center signal to the ideal signal;
   keeping the center signal unchanged if the center signal is within a fourth range of the ideal signal; and
   updating the center signal to lag the ideal signal if the center signal is not within the fourth range of the ideal signal.

5. The method of claim 4, wherein the center signal lags the ideal signal by 5°.

6. A method of driving an air core gauge having a magnetically rotatable pointer for indicating a measure of a parameter comprising the steps of
   (a) determining an ideal gauge position based upon the measure of the parameter;
   (b) determining a center angle representative of an assumed position of the pointer of the air core gauge at which there is zero magnetic hysteresis;
   (c) comparing the ideal gauge position to the center angle;
   (d) developing a gauge position command responsive to) the ideal gauge position and 2) the comparison between the ideal gauge position and the center angle; and
   (e) driving the air core gauge according to the determined gauge position command.

7. An apparatus comprising:
   an air core gauge having a magnetically rotatable pointer;
   means for measuring a vehicle parameter;
   means for determining an ideal gauge position responsive to the parameter measurement;
   means for determining a center position representative of an assumed position of the pointer of the air core gauge at which there is zero magnetic hysteresis;
   means for comparing the center position with the ideal gauge position;
   means for determining a gauge command responsive to the ideal gauge position and the comparison;
   means for outputting the gauge command to the air core gauge; and
   means for driving the air core gauge responsive to the output gauge command.

8. The apparatus set forth in claim 7, wherein the gauge command is determined such that, (i) if the center position and the ideal gauge position are within a first range of each other, the gauge command corresponds to the ideal gauge position, (ii) if the center position and the ideal gauge position are within a second range of each other, the gauge command corresponds to a sum of the ideal gauge position and a first offset, and (iii) if the center position and the ideal gauge position are within a third range of each other, the gauge command corresponds to a sum of the ideal gauge position and a second offset.

9. The apparatus set forth in claim 7, wherein the center position is set equal to (i) a previous center position if the previous center position and ideal gauge position are within a fourth range of each other and (ii) a position lagging the ideal gauge position if the center position and ideal position are not within the fourth range of each other.

10. The apparatus set forth in claim 9, wherein the center position lags the ideal gauge position by 5°.

* * * * *